(12) United States Patent
Jones et al.

(10) Patent No.: US 7,589,744 B2
(45) Date of Patent: Sep. 15, 2009

(54) OBJECT PROPERTY DATA REFERENCING LOCATION PROPERTY

(75) Inventors: Simon Alan Jones, Guilford (GB); Paul Joseph McArdle, Bow, NH (US); Scott Anthony Arvin, New Boston, NH (US)

(73) Assignee: Autodesk, Inc., San Rafael, CA (US)

( * ) Notice: Subject to any disclaimer, the term of this patent is extended or adjusted under 35 U.S.C. 154(b) by 731 days.

(21) Appl. No.: 10/657,441

(22) Filed: Sep. 8, 2003

(65) Prior Publication Data

US 2004/0046770 A1 Mar. 11, 2004

Related U.S. Application Data

(60) Provisional application No. 60/408,717, filed on Sep. 6, 2002.

(51) Int. Cl.
*G09G 5/00* (2006.01)
*G06F 19/00* (2006.01)

(52) U.S. Cl. .................. 345/619; 700/97; 715/253; 715/799

(58) Field of Classification Search ................. 345/619, 345/676–680, 649; 715/502, 253, 799; 700/97
See application file for complete search history.

(56) References Cited

U.S. PATENT DOCUMENTS

| 5,444,836 | A | * | 8/1995 | Hollingsworth et al. ..... 345/634 |
| 6,025,849 | A | * | 2/2000 | Felser et al. ................. 345/441 |
| 6,049,340 | A | * | 4/2000 | Matsushita et al. .......... 345/441 |

\* cited by examiner

*Primary Examiner*—Kee M Tung
*Assistant Examiner*—Michelle K Lay
(74) *Attorney, Agent, or Firm*—Gates & Cooper LLP

(57) ABSTRACT

A method, apparatus, and article of manufacture provide the ability to specify and maintain a "location" for an object in a drawing program. A drawing is obtained in a drawing program. One or more objects are obtained in the drawing program. In this regard, one or more of the is a collection of one or more graphical elements. For at least one of the objects, an automatic location property is defined. A value for the location property is obtained from property data of another object, area, or space where the object is "located" (which is based on the location property).

21 Claims, 5 Drawing Sheets

OBJECT PROPERTY DATA REFERENCING LOCATION PROPERTY

CROSS-REFERENCE TO RELATED APPLICATIONS

This application claims the benefit under 35 U.S.C. Section 119(e) of the following commonly-assigned U.S. provisional patent application(s), which is/are incorporated by reference herein:

U.S. Patent Application Ser. No. 60/408,717, filed on Sep. 6, 2002, by Scott Matthew Reinemann, Paul Joseph McArdle, Scott Anthony Arvin, Chad Steven Ames, and Simon Alan Jones, entitled "OBJECT PROPERTY DATA REFERENCING".

BACKGROUND OF THE INVENTION

1. Field of the Invention

The present invention relates generally to computer-aided design (CAD) application programs, and in particular, to a method, apparatus, and article of manufacture for providing, accessing, and using properties for objects in a CAD application program.

2. Description of the Related Art

CAD applications are often used to create drawings used in the architectural, engineering, and construction (AEC) industry. The drawings are often defined by a collection (referred to as objects) of one or more graphical elements, such as lines, circles, polylines, text, or dimensions. For example, a collection of various lines may make up a door or window object. CAD programs may treat each object as a single element for creation, manipulation, and modification. Some CAD programs may also provide objects that are special entities with predefined behaviors and display characteristics.

Information relating to an object may be entered and defined in one or more properties of the object. For example, users may have the capability to enter information about the style, dimensions, location, schedule data, and/or other important characteristics of an object.

There are two types of properties, automatic properties and manual properties. Automatic properties are those properties that a program defines for you, such as the width of a door or the length of a wall. Further, some automatic properties may be established by individual objects, while other automatic properties may be established by a style of an object. For example, a number of doors may have the same style but different widths. A Width automatic property would answer differently for each door. However, those same doors may all have the same thickness, since that is a property of the style. A Thickness automatic property would then answer the same way for each door.

Manual properties are those that the user defines and manually applies to an object. Manual properties may be specific to a user's needs, such as a door number, manufacturer, or finish.

Schedules provide access to both automatic and manual properties. A schedule is a tabulation of data extracted from objects in a drawing. Schedule tables provide a graphic representation (e.g., in tabular form) of schedule data extracted from the drawing, and formatted based on rules that may be established in a schedule table style. Schedule tags may also provide special annotation tags that are linked to a drawing object by a schedule anchor, for the purpose of extracting schedule data, and displaying it on the drawing. Thus, schedule tags provide the capability for displaying schedule data in a drawing. The information contained in a schedule may be used to determine the quantity and type of objects needed for a project. For example, a schedule may list the number, size, and manufacturer for the doors in a project.

As used in the prior art, a schedule contains information extracted from the properties of objects. The value of the properties of the object may either be automatically created or manually created. The creation and editing of manually created properties are time consuming and may be conducted frequently. For example, if a door number is manually created for a series of door objects, and one door is then moved or duplicated to a different location, the number must be manually adjusted to reflect the correct information. Further, the numbers for all the doors may also need to be adjusted.

Automatic properties also have many limitations. For example, prior art automatic properties are limited to being defined by the particular object with the property or by the style for the property. Further, a user may desire to have some manual properties automatically determined. For example, a user may desire to have all of the door numbers automatically determined.

In addition to the above-described deficiencies, the prior art fails to provide the capability for an object to obtain property data from different nearby objects or areas. Accordingly, what is needed is a diverse, flexible, property whose value may be automatically determined based on other nearby objects or areas.

SUMMARY OF THE INVENTION

One or more embodiments of the invention provide the capability for an object to automatically obtain data based on the object's location with respect to another object. In this regard, a location property definition provides a mechanism for an object to obtain property values from property data on a polygonal object, area, or space near the object. The retrieved information may then be used to instantiate the object's own properties. Further, the retrieved data may be used in the schedule data for the object.

A grip (referred to as a data location grip or schedule data location grip) for the object may also be displayed and used to associate the object with a particular polygonal object, area, or space. The grip may be displayed for those objects that have a location property definition. The grip can be used to modify where an object is "located" (e.g., for schedule data purposes).

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

One or more embodiments of the invention provide the ability to specify and maintain a "location" for an object in a computer drawing program. Property data for the object may then be based/retrieved from another object, area, or space where the object is located on or near. A grip may be displayed and used to determine and control where the object is "located" for schedule data/tag (and property data) purposes.

Hardware Environment

Figure 1:
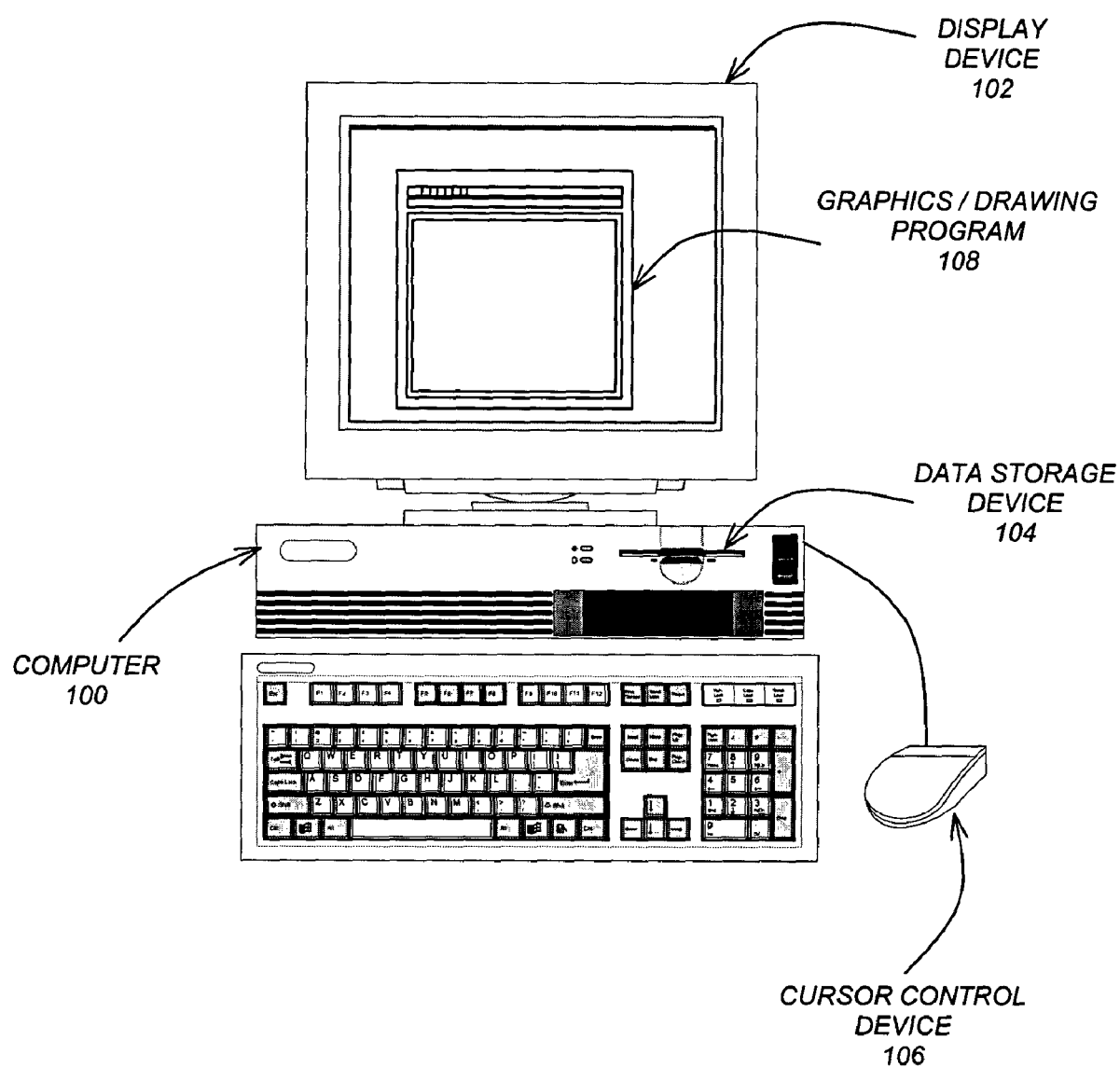
FIG. 1 is an exemplary hardware environment used to implement one or more embodiments of the invention.

FIG. 1 is an exemplary hardware environment used to implement one or more embodiments of the invention. Embodiments of the invention are typically implemented using a computer 100, which generally includes a display device 102, data storage devices 104, cursor control devices 106, and other devices. Those skilled in the art will recognize that any combination of the above components, or any number of different components, peripherals, and other devices, may be used with the computer 100.

One or more embodiments of the invention are implemented by a computer-implemented graphics program 108, wherein the graphics program 108 is represented by a window displayed on the display device 102. Generally, the graphics program 108 comprises logic and/or data embodied in or readable from a device, e.g., one or more fixed and/or removable data storage devices 104 connected directly or indirectly to the computer 100, one or more remote devices coupled to the computer 100 via a data communications device, etc.

Those skilled in the art will recognize that the exemplary environment illustrated in FIG. 1 is not intended to limit the present invention. Indeed, those skilled in the art will recognize that other alternative environments may be used without departing from the scope of the present invention.

Software Embodiments

Figure 2:
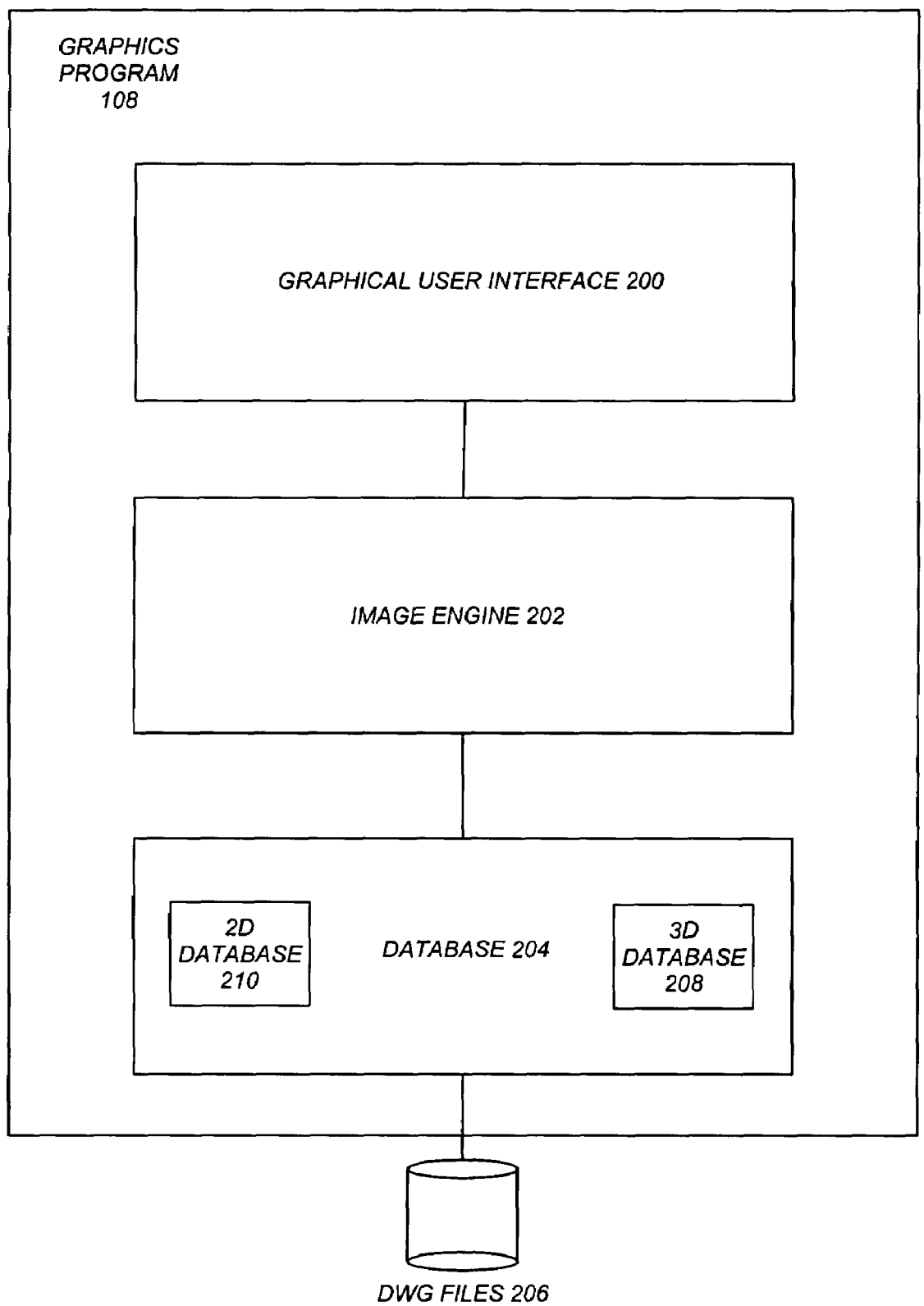
FIG. 2 is a block diagram that illustrates the components of the graphics program in accordance with one or more embodiments of the invention.

FIG. 2 is a block diagram that illustrates the components of the graphics program 108 in accordance with one or more embodiments of the invention. There are three main components to the graphics program 108, including: a Graphical User Interface (GUI) 200, an Image Engine (IME) 202, and a DataBase (DB) 204 for storing objects in Drawing (DWG) files 206.

The Graphical User Interface 200 displays information to the operator and provides the functionality for the operator's interaction with the graphics program 108.

The Image Engine 202 processes the DWG files 206 and delivers the resulting graphics to the monitor 102 for display. In one or more embodiments, the Image Engine 202 provides a complete application programming interface (API) that allows other computer programs to interface to the graphics program 108 as needed.

The Database 204 is comprised of two separate types of databases: (1) a 3D database 208 known as the "3D world space" that stores 3D information; and (2) one or more 2D databases 210 known as the "2D view ports" that stores 2D information derived from the 3D information.

Object List

Figure 3:
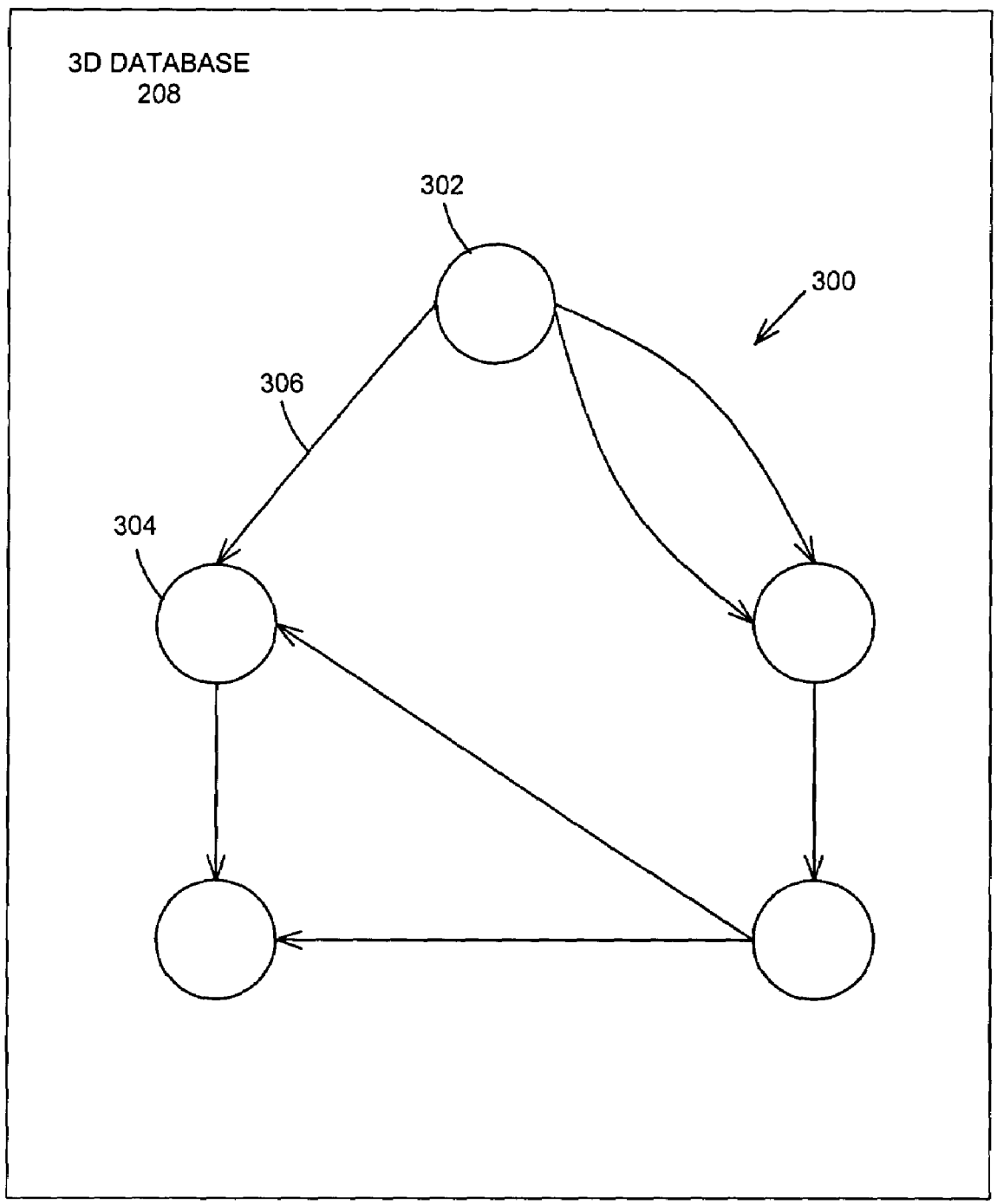
FIG. 3 is a block diagram that illustrates the structure of an object list maintained by a 3D database in accordance with one or more embodiments of the invention.

FIG. 3 is a block diagram that illustrates the structure of an object list 300 maintained by the 3D databases 208 in accordance with one or more embodiments of the invention. The object list 300 is usually comprised of a doubly linked list having a list head 302 and one or more objects 304 interconnected by edges 306, although other structures may be used as well. There may be any number of different object lists 300 maintained by the 3D databases 208. Moreover, an object 304 may be a member of multiple object lists 300 in the 3D databases 208.

Property Sets and Property Set Definitions

As described above, drawings (e.g., stored in DWG files 206) are often defined by a collection of one or more graphical elements (referred to as objects 304), such as lines, circles, polylines, text, or dimensions. Information relating to an object 304 may be entered and defined in one or more properties of the object 304. For example, users may have the capability to enter information about the style, dimensions, location, schedule data, and/or other important characteristics of an object 304.

A number of object properties (e.g., that may be related) may be grouped together by a user into a property set. The property set may then be attached to an object 304 or a style and becomes the container for the property data associated with the object 304 or style.

A property set definition specifies the characteristics of a group of properties that can be attached to an object 304. For example, a user can create a property set definition named DoorProps that contains property definitions for DoorNumber, DoorWidth, and FireRating. Each property may have a name, description, data type, data format, and default value.

When a property set is created, the user may specify whether the property set applies/attaches to an object(s) or a style(s). Further, property sets, whether attached to objects or to styles, may include both manual and automatic properties.

Location Property

A location property definition may be added to a property set definition. A location property definition is a type of automatic property since the value displayed may be determined automatically, based on its definition, and may not be edited directly. Thus, the location property definition is part of a property set that is attached to/associated with a particular object.

A location property provides a location for the attached object with respect to another object, area, or space. Further, location properties may provide both graphical and non-graphical data for scheduling purposes. In this regard, the values for location properties may be obtained from property data on the other objects, areas, or spaces in or near the attached object. Since the values are obtained from property data for other objects, areas, or spaces, the schedule data for the location property reflects this property data. For example, a user may assign doors to spaces or areas that represent rooms. With the location property, door numbers may be automatically generated and based upon the room number. Accordingly, if a door is located within a space, it can get the space's number and use that value in its own schedule data. Thus, the space's number may be used to create automatic door numbers based on the room/space the door is located in.

To easily and visually identify the location of the attached object, a data location grip may be displayed. Such a grip may be displayed for any entity that has a property set attached to it that contains a location property definition. The grip can be used to modify where an object is "located" for purposes of property values (e.g., schedule data purposes). For example, if the normal schedule data location for a door is in a space on the swing side, the grip can be used to change the data location to the adjacent space.

Figure 4:
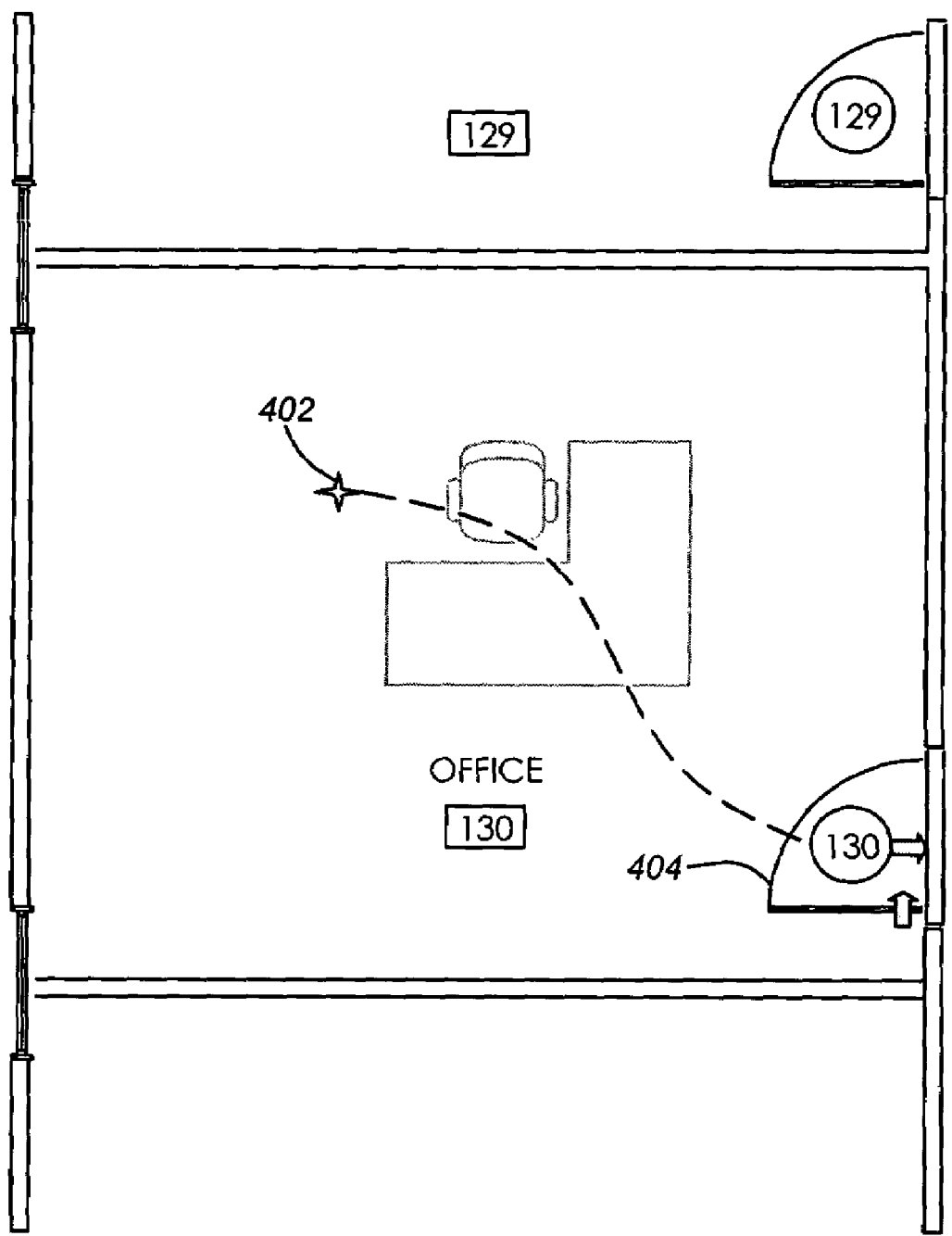
FIG. 4 illustrates an example of the use of a location property with respect to a door in accordance with one or more embodiments of the invention.

FIG. 4 illustrates an example of the use of a location property with respect to a door in accordance with one or more embodiments of the invention. As illustrated, the location grip 402 may comprise a star-shaped glyph and identifies the "location" for door 404. However, the shape of the glyph may vary and the invention is not intended to limit the shape of the glyph to a star or any other shape. For example, the grip 402 glyph may be a circle, square, rectangle, cross, arrow, polygon, or any other shape.

Since the location grip 402 is located within office space 130, the door 404 is able to obtain the room number 130 for its' own data. Thus, the object (e.g., door 404) retrieves the property data from a space, area, or polygon (e.g., room 130) under the position of the grip 402. To move the location, the grip 402 may be selected and moved over another space in the drawing (e.g., into room 129). A curved dashed line may represent the attachment between the grip 402 and the object 404.

Once the location property has been created for an object, data for the object reflects the data for the space where the object is located. Further, when the grip 402 is moved, the data may be dynamically updated to reflect the current data for the object 404. In this regard, schedule data for an object 404 may automatically reflect the appropriate location information.

If the location grip 402 is located in an area where no space has been defined, the data for the object 404 may contain an appropriate message (e.g., "Space Not Found"). Alternatively, embodiments of the invention may not permit the location grip 402 to be located in an undefined location. In yet another embodiment, the location grip 402 may have an altered display to indicate whether the space has been defined or not (e.g., the grip 402 may be dimmed, change colors, or a tip may be displayed when the cursor is located over the grip 402).

Thus, as described above, a property set for an object may contain a location property definition that specifies an associated location for the object. The value of the location may vary from a particular area, space, polygon, or other type of location. Data for the object may then be automatically retrieved from another object (e.g., the area, space, polygon, etc.) where the original object is "located". Further, the location of the object may be changed easily using a location grip. Such an automatic retrieval of information and ease of use provides flexibility and versatility in establishing drawings and schedules in the AEC industry.

Logical Flow

Figure 5:
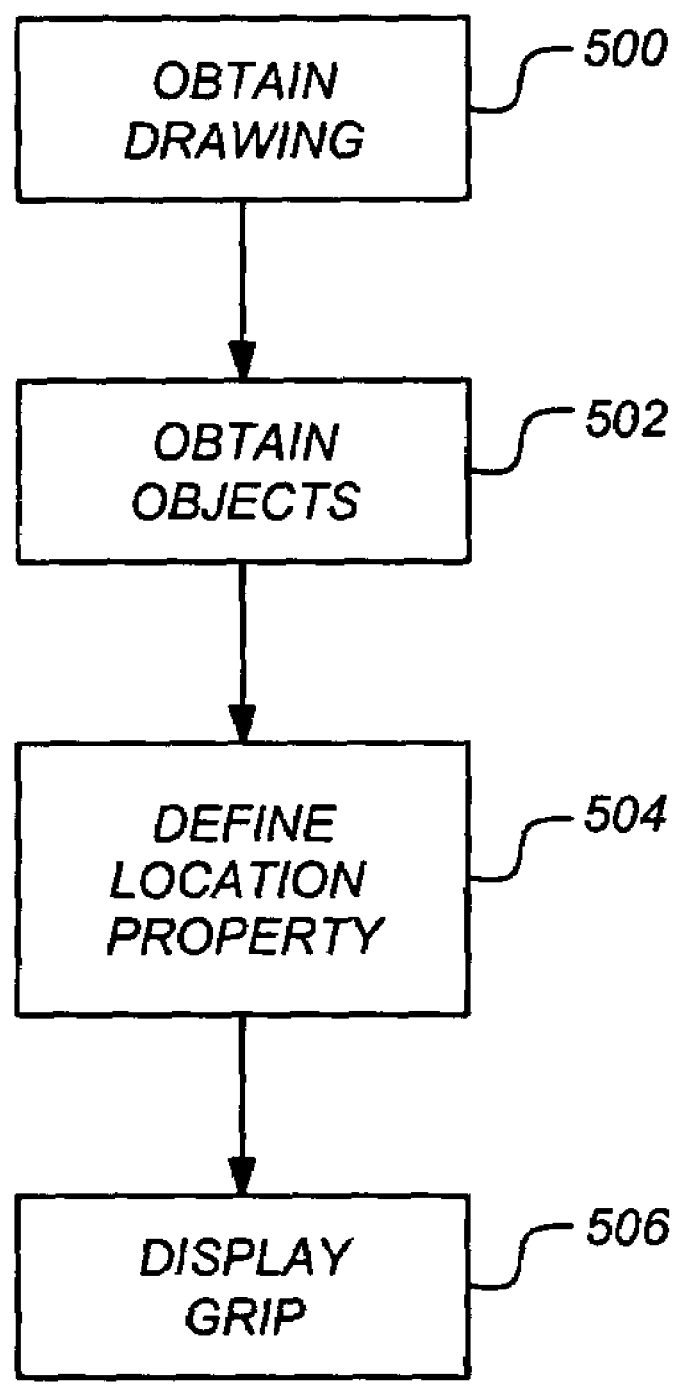
FIG. 5 is a flow chart illustrating the logical flow for the creation and use of a location property in accordance with one or more embodiments of the invention.

FIG. 5 is a flow chart illustrating the logical flow for the creation and use of a location property in accordance with one or more embodiments of the invention. At step 500, a drawing is obtained in a computer drawing program (e.g., a computer-aided design program). At step 502, one or more objects are obtained in the drawing program. At least one of the objects is a collection of one or more graphical elements.

At step 504, an automatic location property is defined for one or more of the objects. In this regard, the location property may be part of a property set definition attached to one or more of the objects. A value for the location property is obtained from property data of another object area, or space. The value may then be retrieved and used for schedule data or a tag of the object.

As described above, one of the objects may be a door and the location property may be used to create an automatic door number for the door based on a space the door is located in or near.

At step 506, a grip is displayed. A position of the grip in the drawing determines the object, area, or space where the property data is obtained from. In this regard, to modify or change the object, area, or space where property data is obtained from, the grip may be moved/dragged by the user (e.g., using a cursor control device).

Property Set Overrides

In addition to the above, entity based property set "overrides" allow the user to override a property set of an entity in an external reference (referred to as an xref). This allows treating copies of building elements as unique elements (e.g., 3 copies of an xref of an office may exist and overrides allow each door to be treated uniquely).

Property sets may allow the ability to override property set data on entities in xrefs somewhere higher up in a xref hierarchy. Such override capabilities allows one to programmatically differentiate between copies of the same building element. Tags may be enhanced to tag objects in xrefs and provide the user with the ability to put property set data in an xref drawing. Further, scheduling may be enhanced to look for overridden property sets.

Entity based property set "overrides" allow the user to override a property set of an entity in an xref. Typically, these overrides are placed in the system level drawing if in a project management environment, or in the current drawing if not. When tags or schedules look for property set data for entities in xrefs (or blocks), they start in the drawing containing the tags or schedules and ask at each block reference in the insert path if there is a valid overridden property set for the specified entity. As soon as it finds a valid override, it stops looking and uses that. If it doesn't find an override, it looks to see if it can find the property set on the actual entity (or style). The term override may be slightly misleading because unlike the display system, the entity itself doesn't need to have a property set attached to it in order for it to be overridden.

Property set data that is meant to be overridden (e.g., door number or door finish if door finish varies per floor) is placed as an override in the system drawing (e.g., the construct level drawing). With one or more exceptions, all commands that create property set overrides (e.g., tagging, edit schedule data, browse property data, etc.) create the override in the system level drawing (if above or at the system level drawing when in a project management setup) or in the current drawing (if below the system or not in a project management setup).

Property sets may also be obtained through a tag reference (e.g., a user may select a tag that references a door in an xref). If one object is selected, then a referenced name of an object (referred to as ObjectName) may be replaced with the actual name as displayed in an object property manager (OPM). If multiple objects are selected, then ObjectName may be replaced with "Objects", unless all objects are of the same (known) type in which case a plural form may be used.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for specifying a location for an object in a drawing program comprising:
   (a) obtaining a drawing having two or more existing objects in a drawing program;
   (b) identifying one of the objects in the drawing program, wherein the identified object comprises a collection of one or more graphical elements;
   (c) defining, without moving the identified object in the drawing, an automatic location property for the identified object, wherein:
      (i) the automatic location property provides a location, within the drawing, for the identified object with respect to another object, area, or space; and (ii) a value of a property of the identified object is obtained from property data of the other object, area, or space based on the location of the identified object; and (d) displaying a representation of the automatic location property.

2. The method of claim 1, wherein the automatic location property is part of a property set definition attached to the identified object.

3. The method of claim 1, further comprising retrieving schedule data from the automatic location property.

4. The method of claim 1, wherein:
the identified object comprises a door;
the automatic location property is used to create an automatic door number for the door based on a space the door is located in or near.

5. The method of claim 1, wherein the representation comprises a location grip wherein a position of the location grip in the drawing determines the object, area, or space where the identified object is located and where property data for the identified object is obtained from.

6. The method of claim 5, further comprising modifying the object, area, or space where property data is obtained from by moving the location grip without moving the identified object.

7. The method of claim 1 further comprising automatically retrieving data for the identified object from the other object, area, or space where the identified object is located.

8. An apparatus for specifying a location for an object in a computer drawing program comprising:
(a) a computer having a memory;
(b) an application executing on the computer, wherein the application is configured to:
(i) obtain a drawing having two or more existing objects;
(ii) identifying one of the objects, wherein the identified object comprises a collection of one or more graphical elements; and
(iii) define, without moving the identified object in the drawing, an automatic location property for the identified object, wherein:
(1) the automatic location property provides a location, within the drawing, for the identified object with respect to another object, area, or space; and
(2) a value of a property of the identified object is obtained from property data of the other object, area, or space based on the location of the identified object; and
(iv) display a representation of the automatic location property.

9. The apparatus of claim 8, wherein the automatic location property is part of a property set definition attached to the identified object.

10. The apparatus of claim 8, wherein the application is further configured to retrieve schedule data from the automatic location property.

11. The apparatus of claim 8, wherein:
the identified object comprises a door;
the automatic location property is used to create an automatic door number for the door based on a space the door is located in or near.

12. The apparatus of claim 8, wherein the representation comprises a location grip wherein a position of the location grip in the drawing determines the object, area, or space where the identified object is located and where property data for the identified object is obtained from.

13. The apparatus of claim 12, wherein the application is further configured to modify the object, area, or space where property data is obtained from by moving the location grip without moving the identified object.

14. The apparatus of claim 8 wherein the application is further configured to automatically retrieve data for the identified object from the other object, area, or space where the identified object is located.

15. An article of manufacture comprising computer readable instructions stored on a tangible medium and executable by the computer to perform a method for specifying a location for an object in an object-oriented computer drawing program, the method comprising:
(a) obtaining a drawing having two or more existing objects in a drawing program;
(b) identifying one of the objects in the drawing program, wherein the identified object comprises a collection of one or more graphical elements; and
(c) defining, without moving the identified object in the drawing, an automatic location property for the identified object, wherein:
(i) the automatic location property provides a location, within the drawing, for the identified object with respect to another object, area, or space; and
(ii) a value of a property of the identified object is obtained from property data of the other object, area, or space based on the location of the identified object.

16. The article of manufacture of claim 15, wherein the automatic location property is part of a property set definition attached to identified object.

17. The article of manufacture of claim 15, further comprising retrieving schedule data from the automatic location property.

18. The article of manufacture of claim 15, wherein:
the identified object comprises a door;
the automatic location property is used to create an automatic door number for the door based on a space the door is located in or near.

19. The article of manufacture of claim 15, further comprising displaying a location grip wherein a position of the grip in the drawing determines the object, area, or space where the identified object is located and where property data for the identified object is obtained from.

20. The article of manufacture of claim 19, further comprising modifying the object, area, or space where property data is obtained from by moving the location grip without moving the identified object.

21. The article of manufacture of claim 15 wherein the method further comprises automatically retrieving data for the identified object from the other object, area, or space where the identified object is located.

* * * * *